(12) United States Patent
Fowler (10) Patent No.: US 11,461,045 B2
(45) Date of Patent: Oct. 4, 2022

(54) PLATFORM AGNOSTIC ATOMIC OPERATIONS

(71) Applicant: ADVANCED MICRO DEVICES, INC., Santa Clara, CA (US)

(72) Inventor: Mark Fowler, Boxborough, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/370,035

(22) Filed: Mar. 29, 2019

(65) Prior Publication Data

US 2020/0310684 A1 Oct. 1, 2020

(51) Int. Cl.
| | |
|---|---|
| G06F 12/00 | (2006.01) |
| G06F 3/06 | (2006.01) |
| G06F 12/10 | (2016.01) |
| G06F 9/30 | (2018.01) |
| G11C 7/22 | (2006.01) |
| G11C 7/10 | (2006.01) |

(52) U.S. Cl.
CPC .......... *G06F 3/0659* (2013.01); *G06F 3/0604* (2013.01); *G06F 3/0673* (2013.01); *G06F 12/10* (2013.01); *G06F 9/3004* (2013.01); *G06F 2212/657* (2013.01); *G11C 7/1006* (2013.01); *G11C 7/22* (2013.01)

(58) Field of Classification Search
CPC ...... G06F 3/0659; G06F 3/0604; G06F 12/10; G06F 3/0673; G06F 2212/657; G06F 9/3004; G11C 7/1006; G11C 7/22
See application file for complete search history.

(56) References Cited

U.S. PATENT DOCUMENTS

| | | | |
|---|---|---|---|
| 2014/0267334 A1* | 9/2014 | Duluk, Jr. ............. | G06F 11/073 345/543 |
| 2017/0249254 A9* | 8/2017 | Duluk, Jr. ........... | G06F 12/1009 |
| 2017/0371822 A9* | 12/2017 | Duluk, Jr. ............. | G06F 12/123 |

* cited by examiner

*Primary Examiner* — Arvind Talukdar (57) ABSTRACT

A processing unit is configured to access a first memory that supports atomic operations and a second memory via an interface. The second memory or the interface does not support atomicity of the atomic operations. A trap handler is configured to trap atomic operations and enforce atomicity of the trapped atomic operations. The processing unit selectively provides atomic operations to the trap handler in response to detecting that memory access requests in the atomic operations are directed to the second memory via the interface. In some cases, the processing unit detects a frequency of traps that result from atomic operations that include memory access requests to a page stored in the second memory. The processing unit transfers the page from the second memory to the first memory in response to the trap frequency exceeding a threshold.

15 Claims, 5 Drawing Sheets

PLATFORM AGNOSTIC ATOMIC OPERATIONS

BACKGROUND

Processing units typically implement multiple processing elements that are used to execute multiple threads concurrently or in parallel. For example, graphics processing units (GPUs) include multiple compute units to execute different threads and central processing units (CPUs) include multiple processor cores to execute different threads. The operations performed by a thread are sometimes compiled into multiple instructions that are executed to complete the operations. For example, read-modify-write operations are implemented using a first instruction to read information from a memory location, a second instruction to modify the information, and a third instruction to write the information back to the memory location. An example of a read-modify-write operation is an addition operation that reads a numerical value from a memory location, adds another value to the numerical value, and writes the results of the addition operation to the memory location. In some cases, load or store operations are compiled into multiple machine level instructions. For example, a load of a 64-bit double word (or Dword) can be performed as two load instructions that each load a 32-bit word and a store of a 64-bit Dword can be performed as two store instructions that each store a 32-bit word.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Hardware entities such as graphics processing units (GPUs) and central processing units (CPUs) typically provide support for atomic operations that run completely independently of other operations. Atomic operations complete in a single step relative to other threads even though the atomic operations are subdivided into multiple instructions. That is, the processing unit ensures that the instructions of an atomic operation complete execution without executing any intervening instructions of other threads. Atomicity allows multiple threads to execute operations concurrently using shared memory without encountering race conditions. For example, a first thread performs a first addition operation to read a memory location, add a predetermined value to the value at the memory location, and then write the modified value back to the memory location. A second thread performs a second addition operation to read the modified value from the memory location, add another predetermined value, and write the further modified value back to the memory location. If the first and second addition operations are not executed as atomic operations, the second thread can read the memory location before the first thread has written the modified value back to the memory location, which leads to an incorrect result of the second addition operation.

A hardware entity that supports atomic operations transparently converts code such as read-modify-write operations, loads, stores, and other operations into atomic operations to ensure correct outcomes of these operations. However, not all the hardware in a processing system provides support for atomicity. For example, peripheral component interconnect (PCI) buses and PCI express (PCIe) buses do not support atomicity for operations that require transferring information via the buses. Errors can therefore occur in operations that involve non-local memory accesses over the buses. For example, an atomic operation executing on a GPU provides correct results as long as the atomic operation accesses information stored in memory that is local to the GPU because the GPU provides support for atomicity. However, if the atomic operation issues a memory access request to a virtual address that is mapped to a physical address that is only accessible via a bus or other interface that does not support atomicity for the memory access request, the results of the atomic operation are not guaranteed to be correct. Programmers may not be aware of these potential errors because their code only references virtual addresses and is not necessarily aware of how the processing system has distributed information among local and non-local memories.

FIGS. 1-5 disclose embodiments for transparently providing atomicity to operations performed by software on a first processing unit that accesses non-local memories via an interface that does not support atomicity for the operations by detecting a memory access request to the non-local memory by the operation and determining whether servicing the memory access request requires the interface. The operation is selectively provided to a trap handler based on whether the memory access request requires the interface, e.g., the operation is trapped if the memory access request requires the interface and the operation is not trapped if the memory access request does not require the interface. In response to receiving the operation, the trap handler enforces atomicity for the operation. Some embodiments of the trap handler use a compare-and-swap operation to verify that a value at a memory location indicated by the memory access request has not changed between an initiation of the atomic operation and completion of the atomic operation. The trap handler allows the atomic operation to complete normally (e.g., by modifying or writing to the memory location) if the value at the memory location is unchanged.

Some embodiments of the first processing unit (or a memory management unit associated with the first processing unit) determine whether the memory access request requires the interface by translating a virtual address in the memory access requests to a physical address of the memory location. The memory access request does not require the interface if the physical address indicates a local memory associated with the first processing unit and the interface is required if the physical address indicates a remote memory such as a memory associated with a second processing unit that is connected to the first processing unit via the interface. Some embodiments of the first processing unit detect a frequency of traps that result from memory access requests via the bus. The first processing unit transfers information from the remote memory to the local memory in response to the trap frequency exceeding a threshold.

Figure 1:
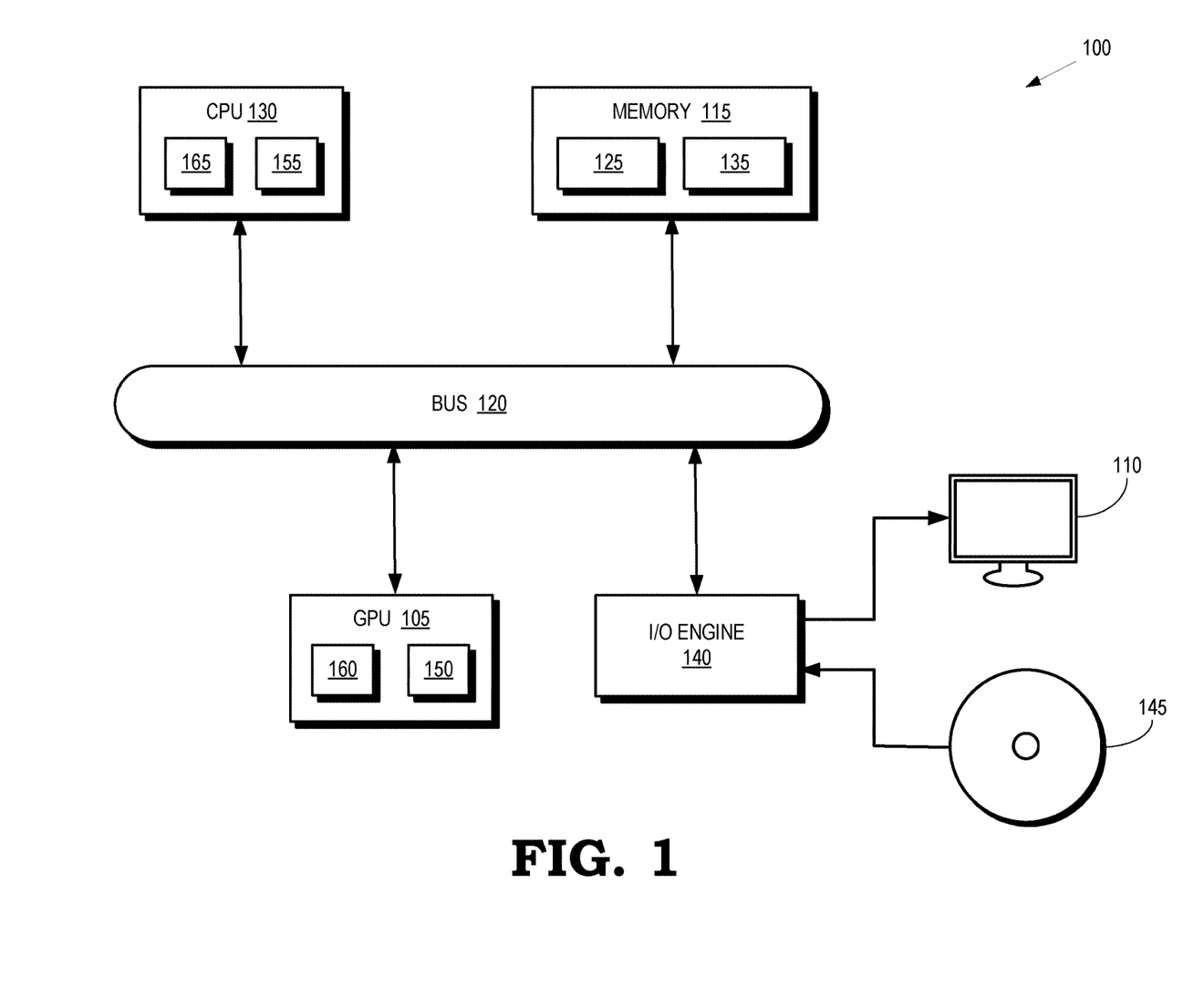
FIG. 1 is a block diagram of a processing system that includes a graphics processing unit (GPU) that implements trapping of memory access requests according to some embodiments.

FIG. 1 is a block diagram of a processing system 100 that includes a graphics processing unit (GPU) 105 that implements trapping of memory access requests according to some embodiments. The processing system 100 includes a display 110 and a memory 115. Some embodiments of the memory 115 are implemented as a dynamic random access memory (DRAM). However, the memory 115 can also be implemented using other types of memory including static random access memory (SRAM), nonvolatile RAM, and the like. In the illustrated embodiment, the GPU 105 communicates with the memory 115 over a bus 120 that is implemented as a peripheral component interconnect (PCI) bus, PCI-E bus, or other type of bus. However, some embodiments of the GPU 105 communicate with the memory 115 over a direct connection or via other buses, bridges, switches, routers, and the like. The GPU 105 can execute instructions stored in the memory 115 and the GPU 105 can store information in the memory 115 such as the results of the executed instructions. For example, the memory 115 can store a copy 125 of instructions from a program code that is to be executed by the GPU 105. Some embodiments of the GPU 105 include multiple processor cores (not shown in the interest of clarity) that can independently execute instructions concurrently or in parallel.

The processing system 100 includes a central processing unit (CPU) 130 for executing instructions. Some embodiments of the CPU 130 include multiple processor cores (not shown in the interest of clarity) that can independently execute instructions concurrently or in parallel. The CPU 130 is also connected to the bus 120 and can therefore communicate with the GPU 105 and the memory 115 via the bus 120. The CPU 130 executes instructions such as program code 135 stored in the memory 115 and the CPU 130 stores information in the memory 115 such as the results of the executed instructions. The CPU 130 is also able to initiate graphics processing by issuing draw calls to the GPU 105. A draw call is a command that is generated by the CPU 130 and transmitted to the GPU 105 to instruct the GPU 105 render an object in a frame (or a portion of an object). The GPU 105 renders the object to produce values of pixels that are provided to the display 110, which uses the pixel values to display an image that represents the rendered object.

An input/output (I/O) engine 140 handles input or output operations associated with the display 110, as well as other elements of the processing system 100 such as keyboards, mice, printers, external disks, and the like. The I/O engine 140 is coupled to the bus 120 so that the I/O engine 140 communicates with the GPU 105, the memory 115, or the CPU 130. In the illustrated embodiment, the I/O engine 140 is configured to read information stored on an external storage medium 145, such as a compact disk (CD), a digital video disc (DVD), and the like. The external storage medium 145 stores information representative of program code used to implement an application such as a video game. The program code on the external storage medium 145 can be written to the memory 115 to form the copy 125 of instructions that are to be executed by the GPU 105 or the CPU 130.

The GPU 105 and the CPU 130 are associated with local memories 150, 155, respectively. In the illustrated embodiment, the local memories 150, 155 are implemented internally by the GPU 105 and the CPU 130. However, some embodiments of the processing system 100 include local memories that are implemented external to the GPU 105 or the CPU 130 and are directly accessible by the GPU 105 or the CPU 130. The GPU 105 and the CPU 130 are also able to access information stored in the local memories 150, 155 of the other entity using memory access request that are transmitted via an interface such as an interface supported by the bus 120. A memory 150, 155 that is local to one processing unit and accessed by other processing unit via a separate interface is referred to herein as a "non-local memory" for the other processing unit. For example, the GPU 105 can process memory access requests that are used to read, write, or modify information stored in locations in the memory 155, which is therefore a non-local memory accessible by the GPU 105. For another example, the CPU 130 can process memory access requests that are used to read, write, or modify information stored in locations in the memory 150, which is therefore a non-local memory accessible by the CPU 130.

Applications executing on the GPU 105 or the CPU 130 include atomic operations that are made up of multiple instructions that complete in a single step relative to other threads even though the atomic operations are subdivided into multiple instructions. Some atomic operations include memory access requests that are used to read, write, or modify information in a memory location that is indicated by a virtual address, which is mapped to a location in a local or external memory. For example, an atomic operation executed by the GPU 105 can include a memory access request to a memory location indicated by a virtual address that maps to the local memory 150 or the external (non-local) memory 155 associated with the CPU 130. The application that generated the atomic operation is typically unaware of whether the virtual address mapped to a local or non-local memory. Thus, if either the memory interface that interconnects the processing entities and local/non-local memories (e.g., the bus 120) or the non-local memory do not support the atomic operation performed by the GPU 105, atomicity of the atomic operation is not guaranteed by the processing system 100.

In order to transparently provide atomicity to operations executed on a processing unit (such as the GPU 105 or the CPU 130) that accesses non-local memories (such as the memories 150, 155) via an interface that does not support atomicity for the operations (such as the bus 120), the GPU 105 or the CPU 130 selectively trap atomic operations that include memory access requests to virtual addresses that map to non-local memories. Some embodiments of the GPU 105 and the CPU 130 implement trap handlers 160, 165, respectively, to trap atomic operations that include a memory access request to a memory that does not support atomicity of the operations or is accessed over an interface that does not support atomicity of the operations. The trap handlers 160, 165 enforce atomicity of the atomic operation. The GPU 105 and the CPU 130 selectively provide the atomic operations to the corresponding trap handlers 160, 165 in response to detecting that the memory access request is directed to a memory connected to the GPU 105 or the CPU 130 via the interface supported by the bus 120. The trap handlers 160, 165 are implemented in software, firmware, hardware, or a combination thereof.

Figure 2:
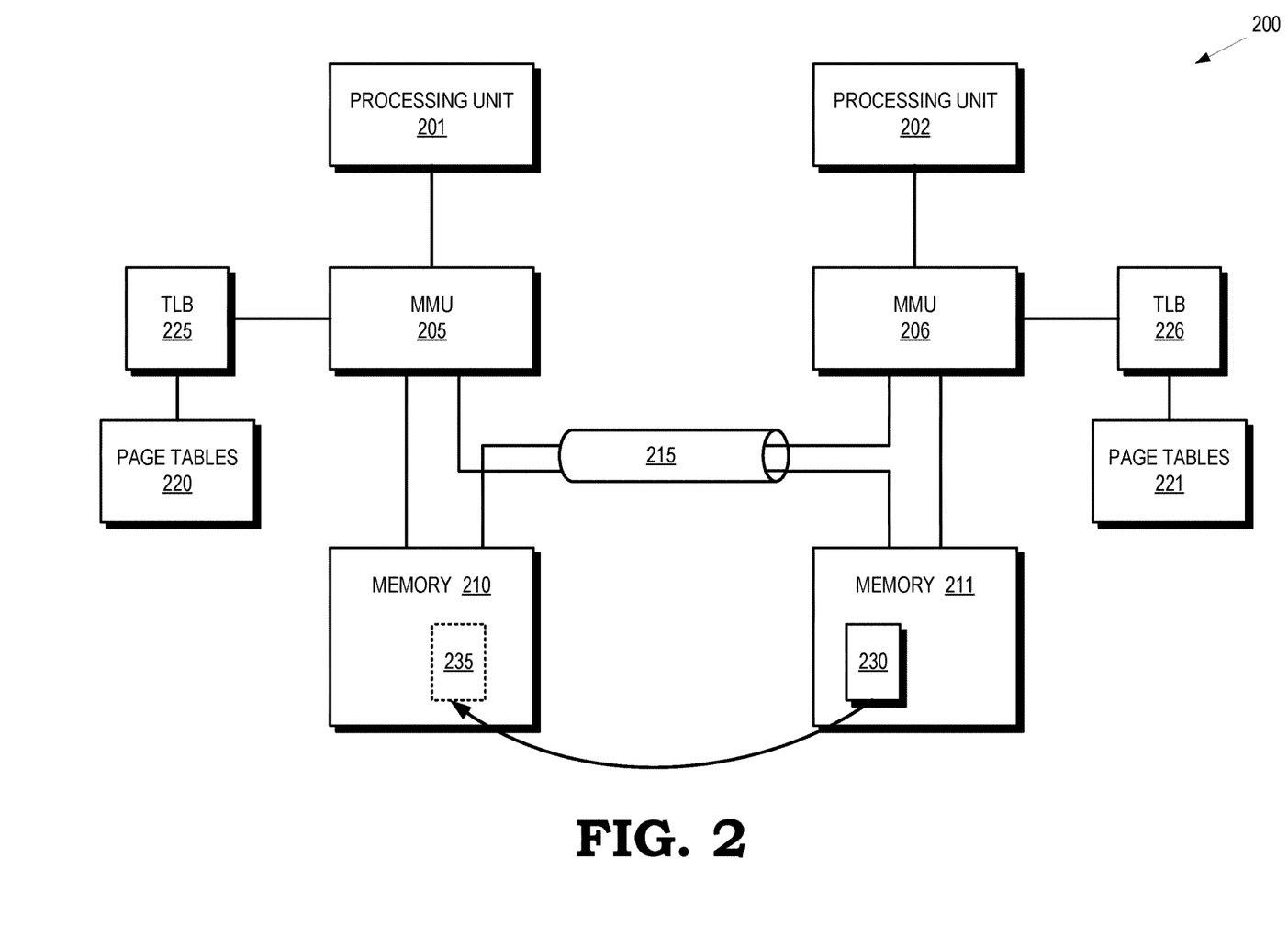
FIG. 2 is a block diagram of a processing system that selectively traps memory access requests to non-local memories according to some embodiments.

FIG. 2 is a block diagram of a processing system 200 that selectively traps memory access requests to non-local memories according to some embodiments. The processing system 200 corresponds to some embodiments of the processing system 100 shown in FIG. 1. The processing system 200 includes processing units 201, 202 that are associated with corresponding memory management units (MMUs)

205, 206 and local memories 210, 211. The processing units 201, 202 are also able to access information stored in the non-local memories via an interface 215. For example, the processing unit 201 can access information stored in the non-local memory 211 and the processing unit 202 can access information stored in the non-local memory 210.

The processing units 201, 202 provide memory access requests to the MMUs 205, 206, which direct the memory access requests to the appropriate memories 210, 211 based on addresses in the memory access requests. Some embodiments of the memory access requests include virtual addresses that are mapped to physical addresses in the memories 210, 211. The MMUs 205, 206 translate the virtual addresses in the memory access requests to the correct physical addresses. In some embodiments, the virtual-to-physical address mapping is stored in page tables 220, 221. Frequently used virtual-to-physical address mappings are cached in translation lookaside buffers (TLBs) 225, 226 associated with the processing units 201, 202. The physical address that maps to a virtual address in a memory access request refers to a location in either a local memory or a non-local memory for the corresponding processing unit 201, 202.

As discussed herein, applications executed by the processing units 201, 202 issue atomic operations that include memory access requests. However, the applications are unaware of whether a virtual address included in the memory access request is mapped to a local memory or a non-local memory. Some non-local memories or interfaces between local and non-local memories do not support atomicity of operations such as memory access requests. For example, the interface 215 does not support atomicity of operations that include memory access requests if the interface 215 is implemented as a PCI or PCI-E bus. The processing units 201, 202 (or the corresponding MMUs 205, 206) therefore monitor the physical addresses generated by the virtual-to-physical mapping of virtual addresses in the memory access requests included in an atomic operation. The memory access request is selectively trapped (e.g., by a trap handler) based on the location indicated by the physical address. For example, a memory access request in an atomic operation executing on the processor 201 is trapped if the physical address indicates a location in the non-local memory 211. For another example, a memory access request in an atomic operation executing on the processor 201 is not trapped if the physical address indicates a location in the local memory 210.

The trap handler ensures atomicity of the trapped atomic operation. In some embodiments, a compare-and-swap operation is performed to verify that an initial value stored at the location (e.g., the value stored at the location prior to initiation of the atomic operation) has not been changed during execution of the atomic operation. Any change in the initial value prior to performing the compare-and-swap operation indicates that another thread has accessed the location, which violates the atomicity requirement. The atomic operation is only allowed to complete, e.g., by writing or modifying the location in the non-local memory, in response to the compare-and-swap operation verifying that the initial value is unchanged from the initial value prior to performing the comparison. The atomic operation is not allowed to complete if the initial value is changed prior to performing the comparison. In some embodiments, an error is indicated to the thread that issued the atomic operation in response to the atomic operation not being allowed to complete.

Trapping the atomic operations allows the processing system 200 to continue execution of the atomic operation, while also ensuring atomicity, in the event that a memory access instruction in the atomic operation accesses a non-local memory via an interface that does not support atomic operations.

Some embodiments of the processing system 200 identify memory pages that are frequently accessed over the interface 215 and migrate these memory pages from a non-local memory to a local memory to improve performance. For example, the processing unit 201 can monitor a frequency of memory access requests to a page 230 in the non-local memory 211 via the interface 215. The frequency of accesses to the page 230 is compared to a threshold frequency that corresponds to a frequency of accesses at which the overhead required to migrate the page 230 to the region 235 in the local memory 210 is more than compensated for by the increase in performance of atomic operations that include memory access requests to the page 230. In response to the frequency exceeding the threshold frequency, the processing system 200 migrates the page 230 from the non-local memory 211 to the region 235 in the local memory 210. Migration of the page 230 to the region 235 is performed transparently to the application that is generating the atomic operations.

Figure 3:
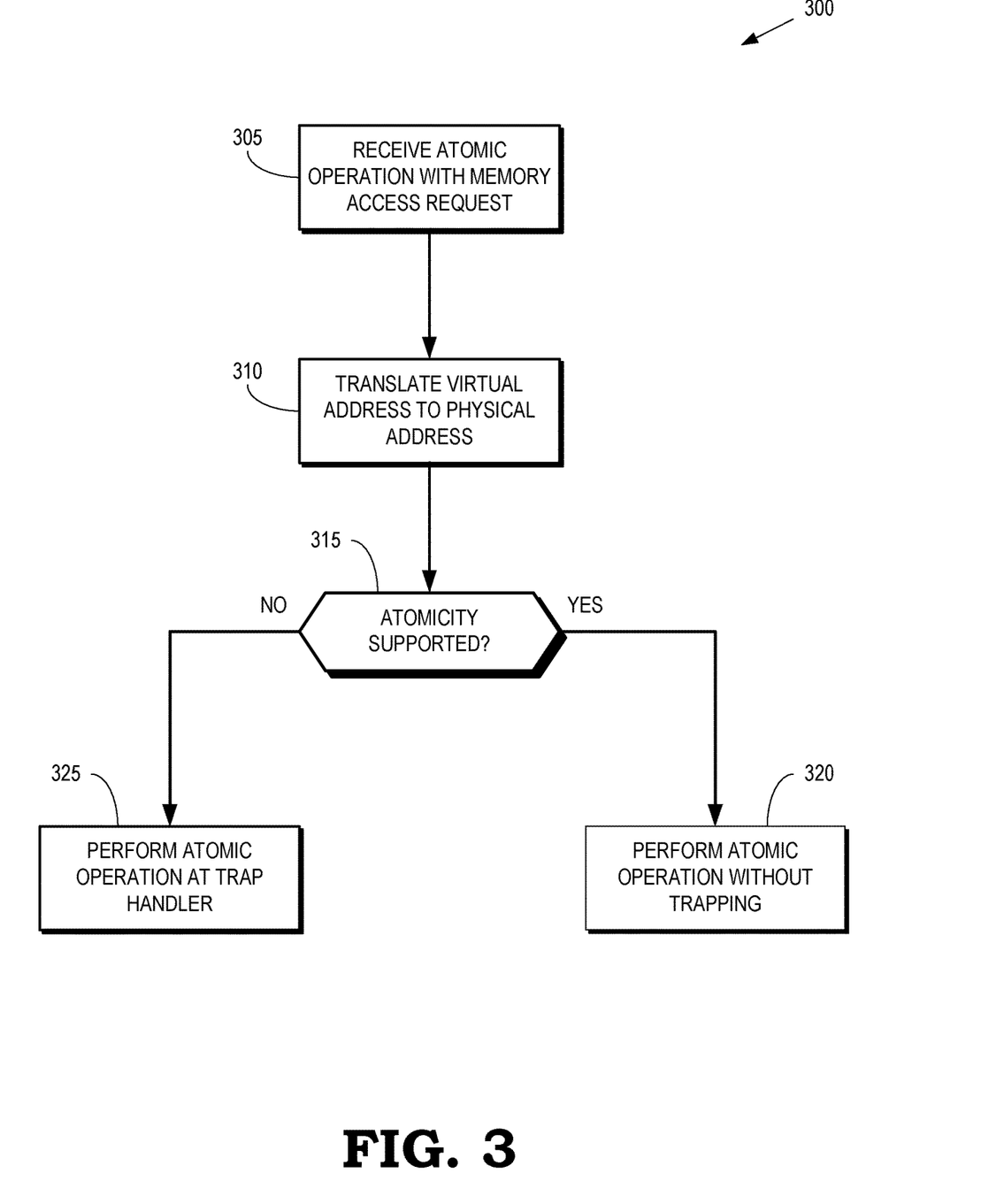
FIG. 3 is a flow diagram of a method of selectively trapping an atomic operation that includes a memory access request according to some embodiments.

FIG. 3 is a flow diagram of a method 300 of selectively trapping an atomic operation that includes a memory access request according to some embodiments. The method 300 is implemented in some embodiments of the processing system 100 shown in FIG. 1 and the processing system 200 shown in FIG. 2.

At block 305, a processing unit initiate execution of an atomic operation that includes a memory access request. A memory location in either a local memory or a non-local memory is indicated by a virtual address in the memory access request. The local memory supports atomicity of the operation that includes the memory access request and the non-local memory (or an interface to the non-local memory) does not support atomicity of the operation that includes the memory access request.

At block 310, the processing unit (or an associated MMU) translates the virtual address in the memory access request to a physical address that indicates a location in the local memory or the non-local memory. Translation is performed using page tables or a translation lookaside buffer.

At decision block 315, the processing unit determines whether the physical address is in the local memory or the non-local memory. If the physical address is in the local memory that supports atomic operations, the method 300 flows to block 320. If the physical address is in the non-local memory that does not support atomic operations or is connected to the processing unit via an interface that does not support atomic operations, the method 300 flows to block 325.

At block 320, the processing unit (or the associated MMU) processes the memory access request as part of the atomic operation. The atomic operation is not trapped, e.g., by a trap handler, because the local memory supports atomic operations.

At block 325, the atomic operation is trapped. Some embodiments of the processing unit (or the associated MMU) trap the atomic operation by providing the atomic operation to a trap handler that ensures atomicity of the atomic operation. Some embodiments of the trap handler perform a compare-and-swap operation to verify that the location indicated by the physical address has not been modified between an initiation of the atomic operation and performing the compare-and-swap operation. The atomic operation is allowed to complete in response to verifying that the physical address has not been modified.

Figure 4:
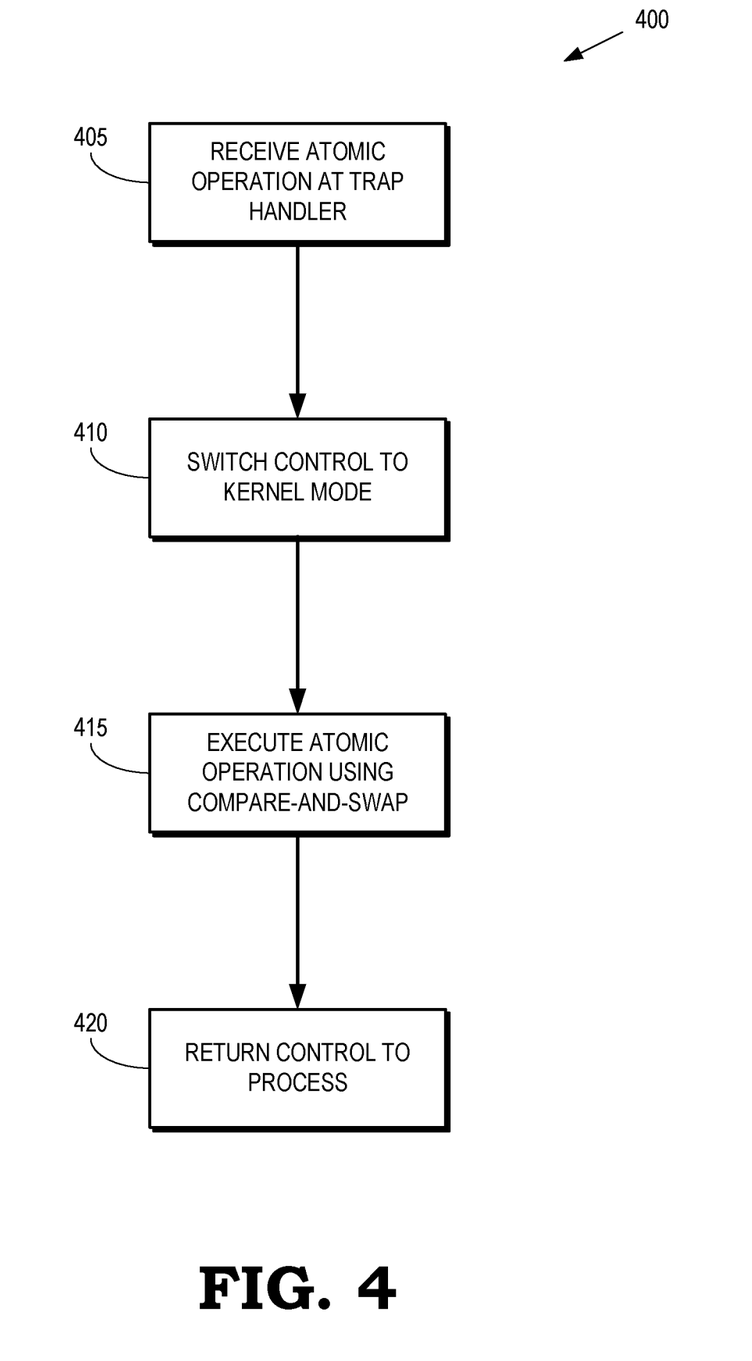
FIG. 4 is a flow diagram of a method of trapping an atomic operation that includes a memory access request according to some embodiments.

FIG. 4 is a flow diagram of a method 400 of trapping an atomic operation that includes a memory access request according to some embodiments. The method 400 is implemented in some embodiments of the processing system 100 shown in FIG. 1 and the processing system 200 shown in FIG. 2.

At block 405, an atomic operation is received at a trap handler. For example, a processing unit provides the atomic instruction to the trap handler in response to a memory access request in the atomic operation referencing a memory location in a non-local memory that does not support atomicity of operations that include memory access requests or referencing the memory location via an interface that does not support atomicity of operations that include memory access requests.

At block 410, control of the process is switched to kernel mode to allow the trap handler to handle the atomic operation and ensure atomicity.

At block 415, the trap handler executes the atomic operation using compare-and-swap. In some embodiments, the trap handler determines an initial value at the memory location indicated in the memory access request prior to initiating the atomic operation. The atomic operation including the memory access request is then performed. Prior to completing the atomic operation, e.g., prior to allowing the atomic operation to write or modify the memory location, the trap handler compares the initial value to the current value at the memory location. If the two values match, indicating that no other processes or threads have written or modified the memory location during the atomic operation, the trap handler allows the atomic operation to complete, e.g., by writing or modifying the location. The atomic operation is not allowed to complete if the two values are different.

At block 420, control is returned to the process that was executing on the processing unit prior to trapping the atomic operation.

Figure 5:
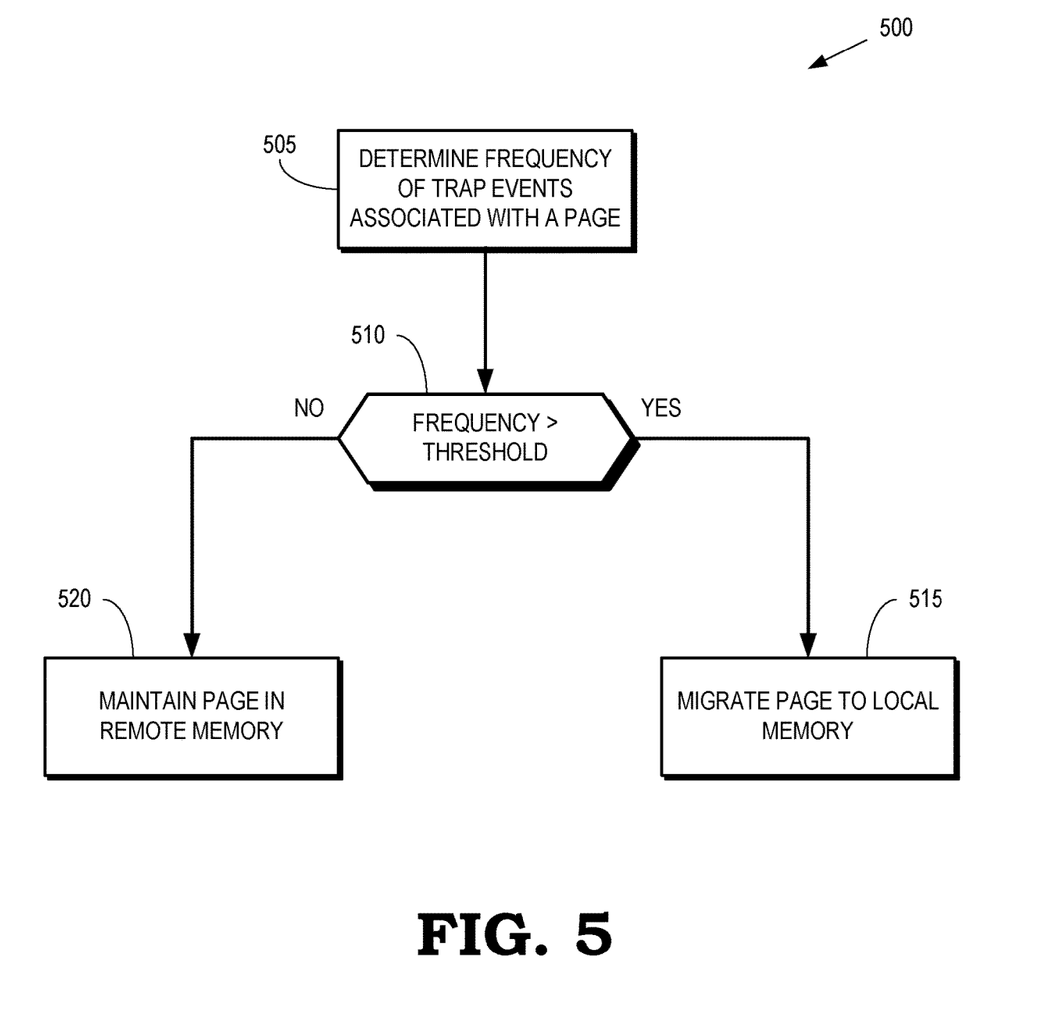
FIG. 5 is a flow diagram of a method of selectively migrating pages of memory based on a frequency of trapping events according to some embodiments.

FIG. 5 is a flow diagram of a method 500 of selectively migrating pages of memory based on a frequency of trapping events according to some embodiments. The method 500 is implemented in some embodiments of the processing system 100 shown in FIG. 1 and the processing system 200 shown in FIG. 2.

At block 505, a processing unit monitors a frequency of trapping events associated with the page in the non-local memory. In some embodiments, the processing unit counts a number of atomic operations that are trapped in response to a memory access request in the atomic operation referencing a non-local memory that does not support atomicity of the operations or referencing the non-local memory via an interface that does not support atomicity of the operations. The frequency is determined based on the number of atomic operations that are trapped during a time interval.

At decision block 510, the processing unit compares the frequency to a threshold frequency that is determined by comparing overhead required to migrate the page from the non-local memory to the local memory and the potential performance gains achieved by avoiding trapping of atomic operations that include memory access requests referencing the page in the non-local memory. The overhead exceeds the performance gain if the frequency is lower than the threshold and the performance gain exceeds the overhead if the frequency is higher than the threshold. If the frequency exceeds the threshold, the method 500 flows to block 515 and the processing unit migrates the page from the non-local memory to the local memory. If the frequency is less than the threshold, the method 500 flows to the block 520 and the page remains in the non-local memory.

A computer readable storage medium may include any non-transitory storage medium, or combination of non-transitory storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

In some embodiments, certain aspects of the techniques described above may implemented by one or more processors of a processing system executing software. The software includes one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. An apparatus comprising:
a first processing unit configured to access a first memory that supports atomic operations and a second memory via an interface, wherein at least one of the second memory and the interface does not support atomicity of the atomic operations;
enforce atomicity of an atomic operation that includes a memory access request, in response to detecting that the memory access request is directed to the second memory via the interface;
monitor a frequency of events associated with a page in the second memory, each of the events corresponding to enforcement of atomicity of an atomic operation associated with the page; and
migrate the page from the second memory to the first memory responsive to determining that the frequency of the events exceeds a threshold frequency.

2. The apparatus of claim 1, wherein the first processing unit is configured to determine whether the memory access request is directed to the second memory via the interface based on a translation of a virtual address in the memory access request to a physical address.

3. The apparatus of claim 2, wherein the first processing unit is configured to enforce atomicity of the atomic operation in response to the physical address being in the second memory.

4. The apparatus of claim 2, wherein the first processing unit processes the memory access request as part of the atomic operation in response to the physical address being in the first memory.

5. The apparatus of claim 2, further comprising:
a memory management unit (MMU) configured to translate the virtual address to the physical address and selectively provide the atomic operation directly to the interface or to the first processing unit based on whether the physical address is in the first memory or the second memory.

6. The apparatus of claim 1, wherein the first processing unit is configured to perform a compare-and-swap operation to verify that a value at a memory location indicated by the memory access request has not changed between an initiation of the atomic operation and performance of the compare-and-swap operation.

7. The apparatus of claim 6, wherein the first processing unit is configured to allow the atomic operation to modify or write to the memory location in response to the value at the memory location being unchanged.

8. A method comprising:
receiving, at a first processing unit configured to access a first memory that supports atomic operations and a second memory via an interface, an atomic operation including a memory access request, wherein at least one of the second memory and the interface does not support atomicity of the atomic operations; and
selectively enforcing atomicity of the atomic operation based on whether the memory access request is directed to the first memory or the second memory;
monitoring a frequency of events associated with a page in the second memory, each of the events corresponding to enforcement of atomicity of an atomic operation associated with the page; and
migrating the page from the second memory to the first memory responsive to determining that the frequency of the events exceeds a threshold frequency.

9. The method of claim 8, further comprising:
translating a virtual address in the memory access request to a physical address; and
determining whether the memory access request is directed to the second memory via the interface based on the physical address.

10. The method of claim 9, wherein selectively enforcing atomicity of the atomic operation comprises enforcing atomicity of the atomic operation in response to the physical address being in the second memory.

11. The method of claim 10, further comprising:
determining an initial value at a memory location indicated by the memory access request prior to an initiation of the atomic operation.

12. The method of claim 11, further comprising:
verifying that a value at the memory location prior to completion of the atomic operation is unchanged from the initial value.

13. The method of claim 12, wherein selectively enforcing atomicity of the atomic operation comprises allowing the atomic operation to modify or write to the memory location in response to the value at the memory location being unchanged from the initial value.

14. The method of claim 9, wherein selectively enforcing atomicity of the atomic operation comprises processing the memory access request as part of the atomic operation in response to the physical address being in the first memory.

15. An apparatus comprising:
a first processing unit configured to access a first memory that supports atomic operations;
a second processing unit configured to access a second memory; and
an interface configured to support memory access requests from the first processing unit to the second memory, wherein at least one of the second memory and the interface does not support atomicity of the atomic operations, wherein the first processing unit selectively enforces atomicity of atomic operations that include a memory access request based on whether the memory access request is directed to the second memory via the interface, and wherein the first processing unit enforces atomicity of atomic operations, wherein the first processing unit is configured to monitor a frequency of events associated with a page in the second memory, each of the events corresponding to enforcement of atomicity of an atomic operation associated with the page, and to migrate the page from the second memory to the first memory responsive to determining that the frequency of the events exceeds a threshold frequency.

* * * * *